United States Patent
Doi

(10) Patent No.: US 9,759,752 B2
(45) Date of Patent: Sep. 12, 2017

(54) POWER CONSUMPTION AMOUNT ESTIMATING APPARATUS AND POWER CONSUMPTION AMOUNT ESTIMATING METHOD

(71) Applicant: FUJITSU LIMITED, Kawasaki-shi, Kanagawa (JP)

(72) Inventor: Tsunehisa Doi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 730 days.

(21) Appl. No.: 14/057,063

(22) Filed: Oct. 18, 2013

(65) Prior Publication Data
US 2014/0200839 A1    Jul. 17, 2014

(30) Foreign Application Priority Data

Jan. 15, 2013 (JP) ................. 2013-004325

(51) Int. Cl.
*G01R 21/133* (2006.01)
*G06F 9/50* (2006.01)
*G06F 11/30* (2006.01)

(52) U.S. Cl.
CPC ......... *G01R 21/133* (2013.01); *G06F 9/5094* (2013.01); *G06F 11/3003* (2013.01);
(Continued)

(58) Field of Classification Search
CPC ............... G01R 21/133; G06F 11/3003; G06F 11/3062; G06F 11/3093; G06F 2201/815; G06F 9/5094; Y02B 60/142
(Continued)

(56) References Cited

U.S. PATENT DOCUMENTS 8,904,209 B2 *  12/2014  Davis ................ G06F 1/3206
                                                    709/220
2009/0007108 A1 *  1/2009  Hanebutte ......... G06F 11/3409
                                                    718/1
(Continued)

FOREIGN PATENT DOCUMENTS

JP    2010-039513    2/2010
JP    2010-277509    12/2010

OTHER PUBLICATIONS

Japanese Office Action dated Aug. 16, 2016 for corresponding Japanese Patent Application No. 2013-004325, with Partial English Translation, 3 pages.

*Primary Examiner* — John H Le
(74) *Attorney, Agent, or Firm* — Fujitsu Patent Center

(57) ABSTRACT

A power consumption amount estimating apparatus for estimating a power consumption amount of a resource allocated to multiple virtual machines operating on a physical machine, the estimation being made for each virtual machine, includes a power consumption amount measuring unit configured to measure the power consumption amount of the resource; a time identifying unit configured to identify a start and an end time of a duration during which a processor is continuously allocated for one of the virtual machines; a power consumption amount obtaining unit configured to obtain the power consumption amount of the resource during the duration using the power consumption amounts at the start and end times; and a power consumption amount accumulating unit configured to accumulate multiple power consumption amounts of the resource for each virtual machine, the multiple power consumption amounts being obtained during multiple durations, respectively.

18 Claims, 12 Drawing Sheets

(52) U.S. Cl.
CPC ...... *G06F 11/3062* (2013.01); *G06F 11/3093* (2013.01); *G06F 2201/815* (2013.01); *Y02B 60/142* (2013.01)

(58) Field of Classification Search
USPC ............... 702/60; 703/17; 709/219; 711/114; 713/219, 300, 320, 324; 718/1; 719/318
See application file for complete search history.

(56) References Cited

U.S. PATENT DOCUMENTS

2010/0031259 A1    2/2010  Inoue
2011/0213997 A1    9/2011  Kansal et al.

* cited by examiner

FIG.6

POWER CONSUMPTION TABLE (UNIT: J)

| VM-id | VM1 | VM2 | VM3 | |
|---|---|---|---|---|
| CPU | C1 | C3 | C3 | ⎫ |
| MEMORY | M1 | M2 | M3 | ⎬ 602 |
| I/O CONTROLLER | IO1 | IO2 | IO3 | |
| DISK | D1 | D2 | D3 | ⎭ |
| : | : | : | : | ～612 |
| SUBTOTAL | Y1 | Y2 | Y3 | ⎫ |
| COOLING FAN | F1 | F2 | F3 | ⎬ 604 |
| PSU | P1 | P2 | P3 | ⎭ |
| : | : | : | : | ～614 |
| TOTAL | X1 | X2 | X3 | |

600

| VMM |
|---|
| v1 |

RESOURCE POWER CONSUMPTION TABLE (UNIT: J)

| MEASUREMENT TIME | 10 S |
|---|---|
| CPU | J1 |
| MEMORY | J2 |
| I/O CONTROLLER | J3 |
| DISK | J4 |
| COOLING FAN | J5 |
| PSU | J6 |

810

STEADY POWER CONSUMPTION TABLE (UNIT: W)

| | STEADY POWER CONSUMPTION |
|---|---|
| P-idle-mem | W1 |
| P-idle-io | W2 |
| P-idle-disk | W3 |

820

POWER CONSUMPTION AMOUNT ESTIMATING APPARATUS AND POWER CONSUMPTION AMOUNT ESTIMATING METHOD

CROSS-REFERENCE TO RELATED APPLICATIONS

This application is based upon and claims the benefit of priority of the prior Japanese Priority Application No. 2013-004325 filed on Jan. 15, 2013, the entire contents of which are hereby incorporated by reference.

FIELD

The disclosures herein generally relate to a power consumption amount estimating apparatus and a power consumption amount estimating method.

BACKGROUND

A server has a mechanism for measuring power consumption or power consumption amount spent by itself. With such a measuring mechanism, power consumption (amount) may be measured for each resource such as a CPU (Central Processing Unit), a memory, a peripheral circuit, and the like. However, if multiple virtual machines (VMs) are running on a server, it is very difficult to measure power consumption of a resource for each of the virtual machines because the virtual machines share multiple resources.

There exists a technology that estimates power consumption of a virtual server by measuring CPU utilization and memory usage of an operation of the virtual server, converting them to CPU utilization and memory usage on a reference server that has a predetermined hardware configuration, and estimating power consumption on the reference server (see, for example, Patent Document 1).

There exists a technology that obtains power consumption of a virtual machine by providing a state mapping table in which power consumption of an operation corresponding to each operational state of a physical resource is specified, obtaining the number of operations actually executed by the virtual machine on the physical resource where the number is obtained by an operation counter in the physical resource, and multiplying an entry of the table by the number of operations to obtain power consumption (see, for example, Patent Document 2).

RELATED-ART DOCUMENTS

Patent Documents

[Patent Document 1] Japanese Laid-open Patent Publication No. 2010-039513
[Patent Document 2] Japanese Laid-open Patent Publication No. 2010-277509

SUMMARY

According to at least one embodiment of the present invention, a power consumption amount estimating apparatus for estimating a power consumption amount of a resource allocated to multiple virtual machines operating on a physical machine, the estimation being made for each of the virtual machines, includes: a power consumption amount measuring unit configured to measure the power consumption amount of the resource; a time identifying unit configured to identify a start time and an end time of a duration during which a processor is continuously allocated for one of the virtual machines; a power consumption amount obtaining unit configured to obtain the power consumption amount of the resource during the duration using the power consumption amounts at the start and end times; and a power consumption amount accumulating unit configured to accumulate multiple power consumption amounts of the resource for each of the virtual machines, the multiple power consumption amounts being obtained during multiple durations, respectively.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF DRAWINGS

FIG. 6 is a schematic view illustrating an example of a summarized power consumption table;
FIG. 8 is a schematic view illustrating an example of a steady power consumption table.

DESCRIPTION OF EMBODIMENTS

To obtain a power consumption amount of a virtual machine, power consumption amounts of multiple resources used by the virtual machine may be accumulated, respectively. As a physical server may include various resources, it is desirable to measure or estimate power consumption amounts of the respective resources in suitable ways. If power consumption is measured (estimated) for resources used by a specific virtual machine, a power consumption amount of the specific virtual machine can be obtained by accumulating the power consumption amounts of the resources.

Also, by obtaining power consumption amounts of resources used by a virtual machine or a power consumption amount of the virtual machine itself, live migration of the virtual machine may be planned based on it. For example, there may be a case where a specific resource is intensively used by multiple virtual machines. In such a case, namely, if the power consumption amount of a specific resource of a physical machine steadily indicates a high value, a virtual machine to undergo live migration to another physical machine can be identified according to an embodiment of the present invention. By moving a virtual machine having high power consumption on a specific resource by live migration, the lifetime of the specific resource may be prevented from being shortened due to steady high-power consumption.

In the following, embodiments of the present invention will be described with reference to the drawings.

According to at least one embodiment of the present invention, it is possible to conveniently estimate a power consumption amount of a resource of a physical machine for multiple virtual machines operating on the physical machine.

Embodiments

Figure 1:
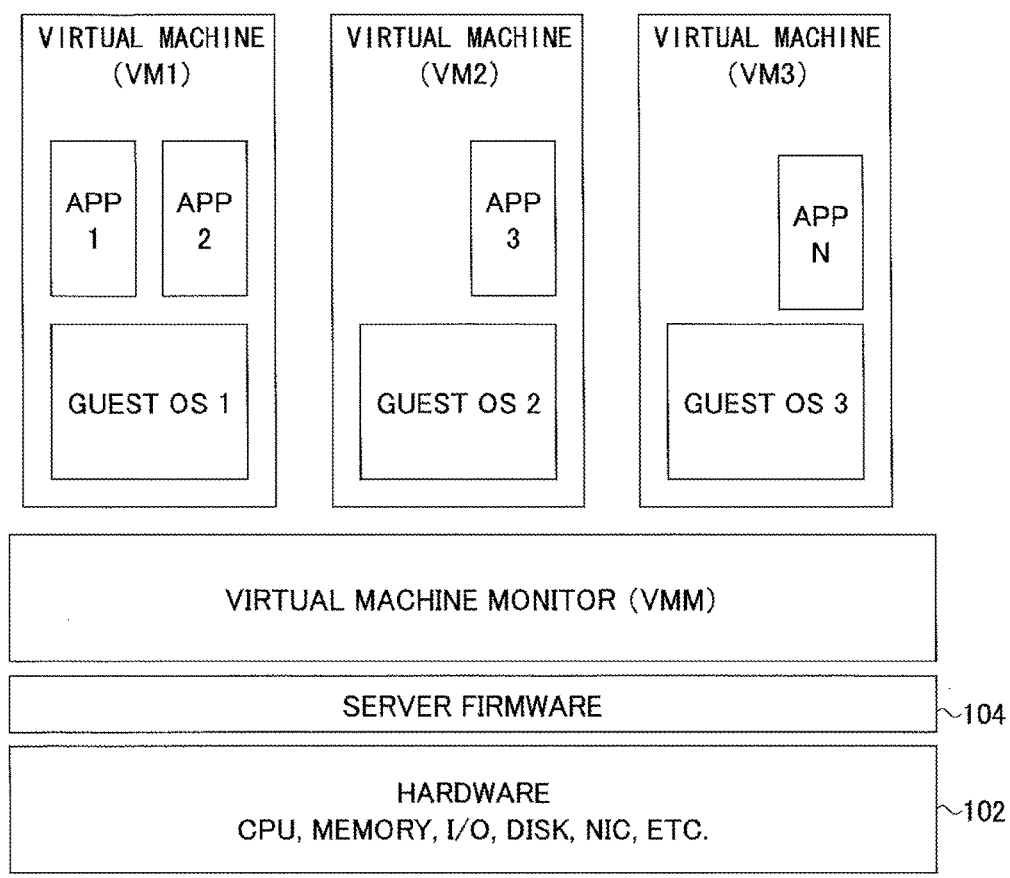
FIG. 1 is a schematic view illustrating multiple virtual machines operating on a physical machine according to an embodiment.

FIG. 1 is a schematic view illustrating multiple virtual machines VM1-VM3 operating on a physical machine 100 according to the present embodiment. The physical machine 100 includes a CPU, a memory, I/Os, a disk, a network interface (NIC), and the like as hardware 102. There exists server firmware 104 that operates on the hardware 102. The server firmware 104 includes firmware for BIOS and for a virtual machine that constitutes an interface between a virtual machine monitor VMM and the hardware 102. The virtual machine monitor VMM provides an operational environment for the virtual machines VM1-VM3. Here, the virtual machine monitor VMM is basic software for virtualization. The virtual machine monitor VMM emulates physical resources for each of the virtual machines VM1-VM3. Also, the VMM arbitrates requests from the virtual machines VM1-VM3, and isolates a memory space for each of the virtual machines VM1-VM3. Here, the embodiments of the present invention do not depend on a type of the virtual machine monitor VMM, which may be any one of a host-type, a hypervisor-type, a hybrid-type, or the like.

Also, although the embodiments of the present invention may be implemented on the virtual machine monitor VMM, implementation is not limited to that. Namely, it is obvious that a part or all of the embodiments of the present invention may be implemented on the server firmware 104 or the hardware 102.

A guest OS 1 is installed on the virtual machine VM1, and applications 1 and 2 operate on the guest OS 1. A guest OS 2 is installed on the virtual machine VM2, and application 3 operates on the guest OS 2. A guest OS 3 is installed on the virtual machine VM3, and application N operates on the guest OS 1. These virtual machine VM1-VM3 can operate on the single physical machine 100 without interfering with each other under control of the virtual machine monitor VMM.

Figure 2:
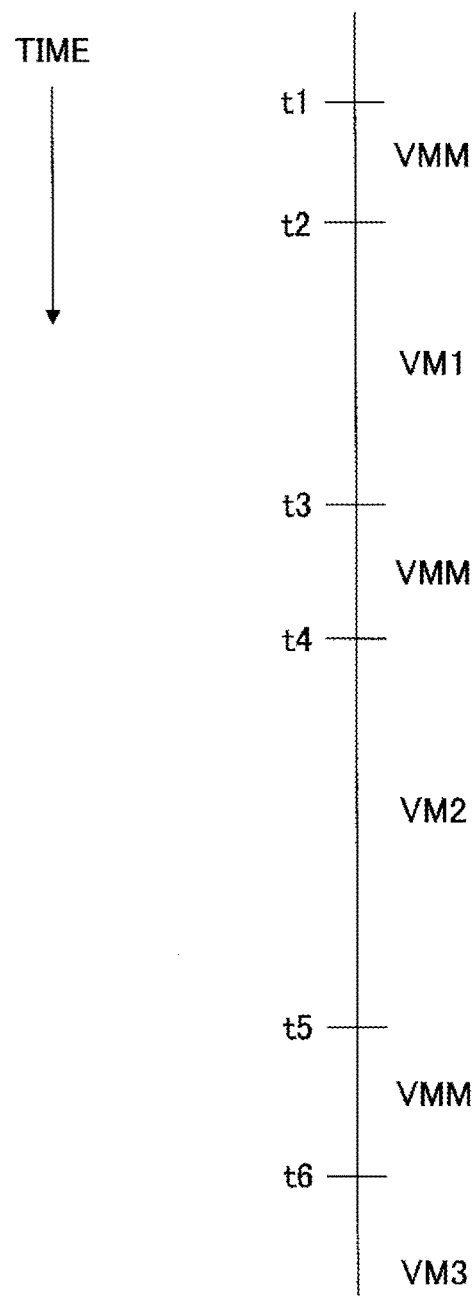
FIG. 2 is a schematic view illustrating switching operations of multiple virtual machines according to an embodiment.

FIG. 2 is a schematic view illustrating switching operations of the virtual machines VM1-VM3 according to the present embodiment. The virtual machine monitor VMM operates from time t1 to t2 to save an operational environment before time t1 and to provide an operational environment for the virtual machine VM1 that has been scheduled to operate next. The virtual machine VM1 operates from time t2 to t3. Similarly, the virtual machine monitor VMM operates from time t3 to t4, the virtual machine VM2 operates from time t4 to t5, the virtual machine monitor VMM operates from time t5 to t6, and the virtual machine VM3 operates from time t6. Switching virtual machines in this way is one of the important roles of a virtual machine monitor.

Figure 3:
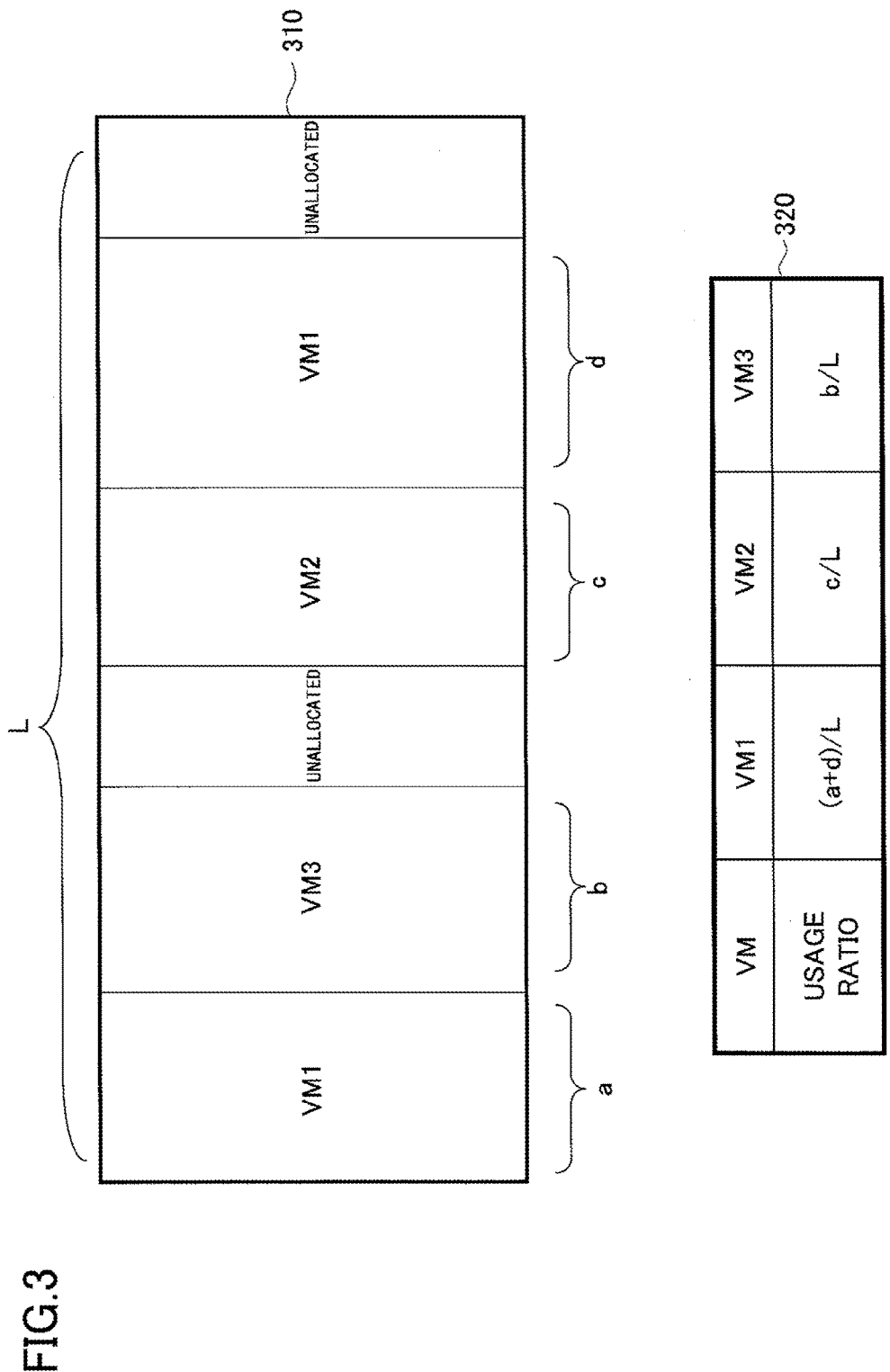
FIG. 3 is a schematic view illustrating memory allocation ratios of multiple virtual machines according to an embodiment.

FIG. 3 is a schematic view illustrating memory allocation ratios of the virtual machines VM1-VM3 according to the present embodiment. A memory 310 is illustrated that has capacity of L as a whole. The virtual machine monitor VMM allocates areas "a" and "d" to the virtual machine VM1, an area "c" to the virtual machine VM2, and an area "b" to the virtual machine VM3. Here, assume that "a" to "d" represent the sizes of areas, respectively. Therefore, as illustrated in a table 320, usage ratios of the memory are (a+d)/L for the virtual machine VM1, c/L for the virtual machine VM2, and b/L for the virtual machine VM3. Memory allocation can be dynamically changed by the virtual machine monitor VMM if necessary. Therefore, if the virtual machine VM3 faces a shortage of memory, for example, the memory area can be expanded by allocating an unallocated area to the virtual machine VM3. Also, if it is determined that a part of the memory area for the virtual machine VM1 is not required any longer, for example, the memory area "a" may be released so that only the memory area "d" is allocated for the virtual machine VM1.

Figure 4:
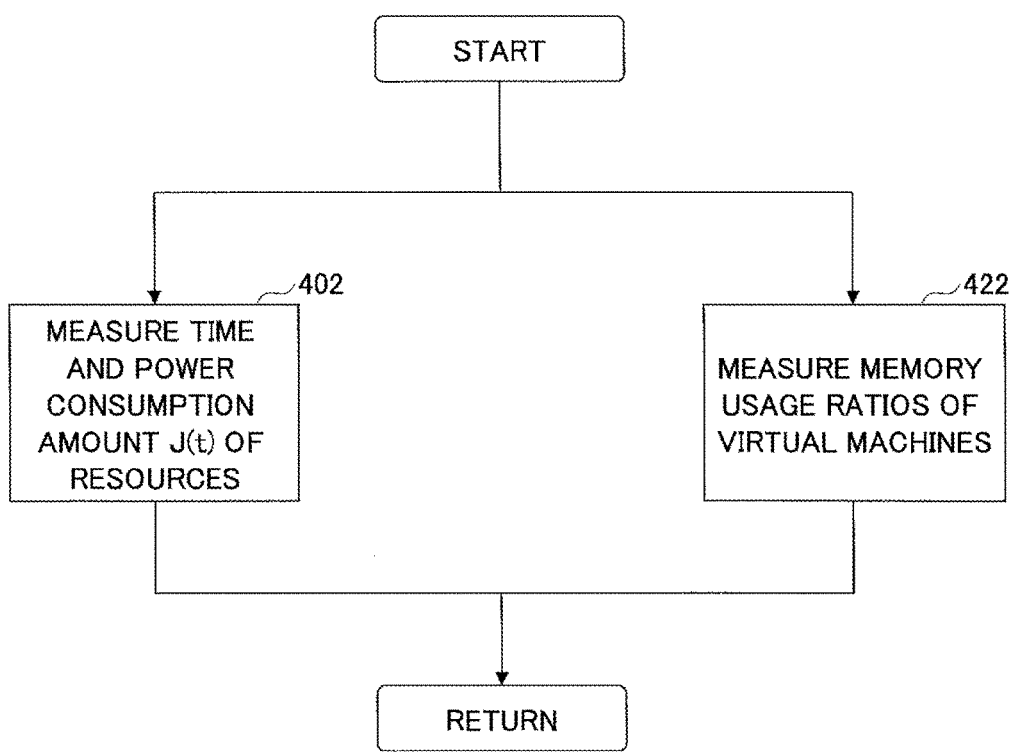
FIG. 4 is a flowchart for measuring resource allocation of virtual machines according to an embodiment.

FIG. 4 is a flowchart for measuring resource allocation of virtual machines according to the present embodiment. The flowchart may be triggered by an interrupt. Here, Steps 402 and 422 are arranged in parallel. Only one of these steps may be executed. Alternatively, both steps may be executed. The steps may be executed in any order.

At Step 402, a power consumption amount J(t) in time t for a resource is measured. Alternatively, power consumption W(t) may be measured instead. Here, time integral of a power consumption rate W(t) is the power consumption amount J(t), which may be obtained, for example, by connecting an integrator with a device measuring power consumption rate W(t). Here, such an integrator may be implemented by an analog circuit or a digital circuit. As the physical machine 100 has multiple resources, it is desirable to execute measurement for each of the resources. This will be described concretely using FIG. 9. In addition, it is desirable to measure the measurement time of a power consumption amount J(t) (or power consumption rate W(t) if necessary). Measurement time may be set to predetermined intervals for a storage device such as a memory. In addition, it is desirable to measure power consumption amounts when virtual machines are switched. Measurement time may depend on characteristics of resources. Here, details will be described later when describing calculation of power consumption amounts for resources using FIG. 5.

At Step 422, usage ratios of the virtual machines VM1-VM3 are measured on a storage section. The usage ratios on the storage section dynamically change while the virtual machines VM1-VM3 operate. For example, if a virtual machine uses a larger physical memory space while another virtual machine uses a smaller physical memory space, it is desirable that a greater power consumption amount of memory is calculated for the virtual machine with the larger memory. Therefore, it is desirable to take dynamically changing memory usage ratios into consideration when calculating power consumption amounts of the virtual machines VM1-VM3 for a storage section such as a memory or a disk. For a resource other than a storage section such as a memory, but whose usage ratios by the virtual machines VM1-VM3 change similarly to the storage section above, usage ratios may be measured at Step 422 to calculate power consumption amounts. Here, instead of obtaining dynamically changing usage ratios of memory areas during operations of the virtual machines VM1-VM3, memory usage ratios may be measured only when a switching of virtual machine operations is started or ended. Alternatively, memory usage ratios may be measured when a switching of virtual machine operations is started and ended, and the average value of the start and end may be used. In this way, a periodic overhead for obtaining memory usage ratios can be reduced while the virtual machines VM1-VM3 operate. Alternatively, measurement of memory usage ratios of the virtual machines VM1-VM3 may be executed by special-purpose hardware, or implemented as a function of the firmware 104. A concrete calculation method of power consumption amounts considering memory usage ratios will be described later using FIG. 5.

Figure 5:
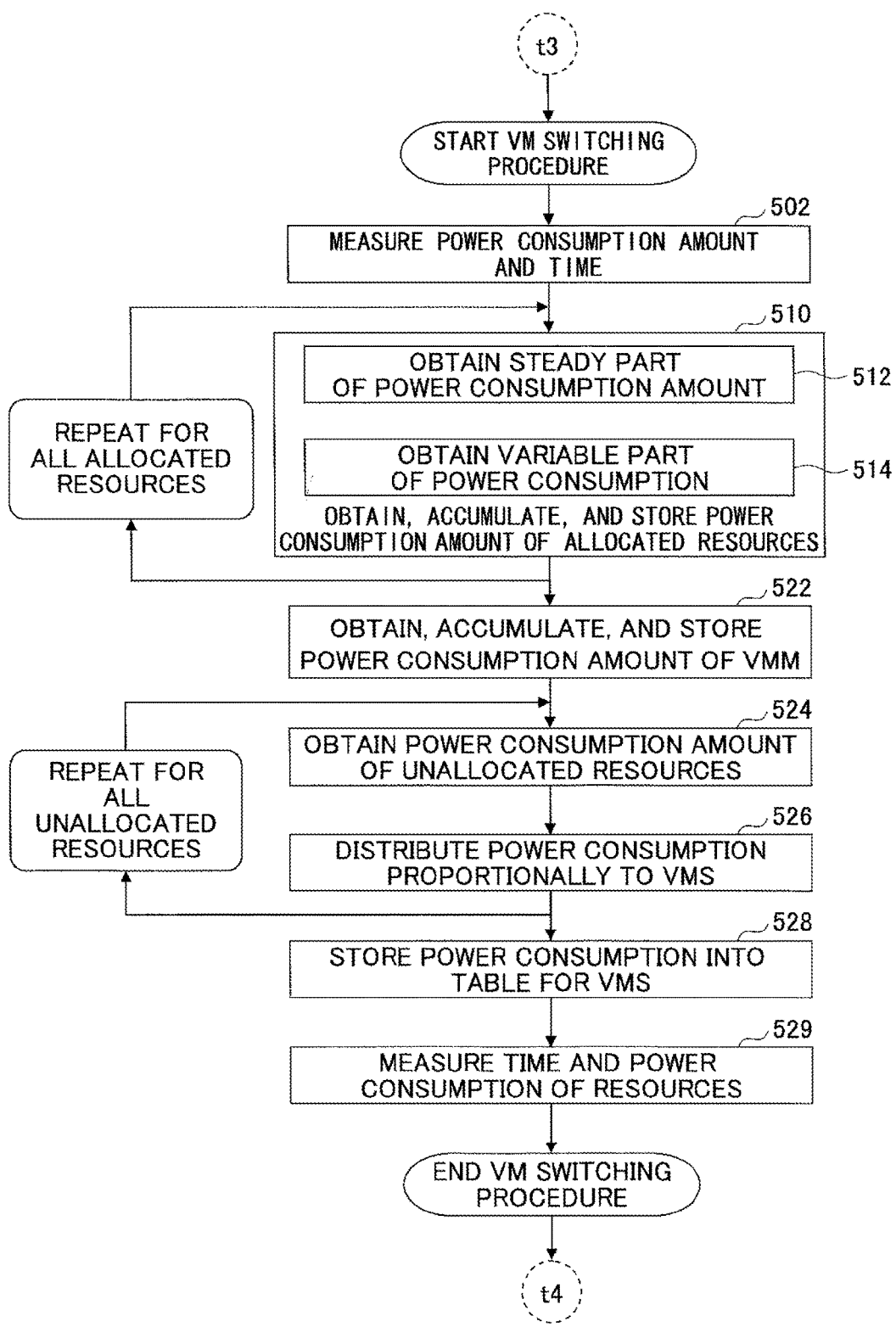
FIG. 5 is a flowchart for measuring power consumption according to an embodiment.

FIG. 5 is a flowchart for measuring power consumption according to the present embodiment. In FIG. 5, the flowchart illustrates just a part of operations of the virtual machine monitor VMM from time t3 to time t4 in FIG. 2, which is for obtaining power consumption amounts. It is noted that the virtual machine monitor VMM executes processing steps other than the processing steps described here. The flowchart in FIG. 5 illustrates a flow for measuring (estimating) power consumption amounts for multiple resources, which includes steps that may not be required for a specific resource. In the following, content of processing will be described for each major resource.

In the following, measuring (estimating) methods of power consumption amount are described for major resources. It is noted that either of the methods may be applied to other resources depending on their characteristics. Also, by accumulating power consumption amounts obtained for the resources used by a specific virtual machine, the power consumption amount of the specific virtual machine can be obtained.

[Calculation Example of Power Consumption Amount of CPU]

It will be described using FIGS. 2, 4, and 5. At time t3, the virtual machine VM1 ends its operation, and control is transferred to the virtual machine monitor VMM. The virtual machine monitor VMM starts a switching procedure between the virtual machines VM1 and VM2.

Next, a relationship between a virtual machine and a CPU will be described. If a CPU is allocated to the virtual machine VM1, the CPU is occupied by the virtual machine VM1 for a certain duration (from time t2 to time t3) to operate only for the virtual machine VM1. The CPU controls the virtual machine VM1 and the other resources. Namely, all of the power consumption amount of the CPU while it is occupied with the virtual machine VM1 may be accumulated to the power consumption amount of CPU for the virtual machine VM1. There are resources other than a CPU that are occupied by a virtual machine in this way. For example, an input/output controller, a bus, or a network controller, and the like are this kind of resources. Although the following description is for a power consumption amount of a CPU, it is noted that power consumption amounts of the same kind of resources can be calculated by substantially the same procedures, respectively.

At Step 502, a power consumption amount of a CPU and time are measured as illustrated in FIG. 4. The power consumption amount of CPU and time may be stored into a memory when measured. Measurement may be executed at Step 502. Also, the time to be stored may be execution time of Step 502.

Also, at Step 529, which is the step just before the end of the virtual machine switching operation at time t4, a power consumption amount of CPU and time may be measured as illustrated in FIG. 4. The measured amount and time may be stored into the memory for later usage.

Although FIG. 5 is illustrated for time t3 to t4 as mentioned above, it is noted that substantially the same processing flow as in FIG. 5 can be executed by the virtual machine monitor VMM at other timings, for example, for time t1 to t2 and time t5 to t6.

At Step 510, a power consumption amount of CPU is calculated for the virtual machine VM1 from time t2 to t3. The power consumption amount of CPU from time t2 to t3, Jcpu(t2, t3), can be calculated by the following formula.

$$Jcpu(t2,t3)=Jcpu(t3)-Jcpu(t2) \qquad (1)$$

Here, Jcpu(t3) is a power consumption amount of CPU at time t3, which has been obtained at Step 502 in FIG. 5. Jcpu(t2) is a power consumption amount of CPU at time t2, which has been obtained and stored at Step 529 executed just before time t2. The power consumption amount of CPU Jcpu(t2, t3) calculated here is accumulated to a previously accumulated power consumption amount of CPU (an entry C1 in a VM power consumption amount table 600 in FIG. 6), and stored into the same location (entry C1) (Step 510).

For other resources, for example, an input/output controller, a bus, a network controller, and the like, power consumption amounts can be calculated for the virtual machine VM1 from time t2 to t3 by substantially the same procedures as for a CPU.

[Calculation Example of Power Consumption Amount of Memory]

As illustrated with the memory 310 in FIG. 3, certain areas in a storage section such as a memory are occupied by the virtual machines VM1-VM3, respectively. For example, assume that a physical machine is in an idle state. Even in this case, the memory consumes power at least for refreshing. It is desirable to distribute such power consumption to the virtual machines VM1-VM3 depending on the usage ratios 320 of the memory as illustrated in FIG. 3. Therefore, based on this idea, it is desirable to obtain a power consumption amount of memory while a physical machine is idle (called a "steady part of power consumption", hereafter) in advance, to distribute the power consumption amount depending on changes in memory allocation. Here, it is desirable to distribute increased parts of power consumption amounts generated by memory access to the respective virtual machines VM1-VM3. Therefore, a power consumption amount of memory Jmem(t2, t3) from time t2 to t3 can be calculated, for example, as follows.

$$Jmem(t2, t3) = \int_{t=t2}^{t3} \alpha(t) \times Wc + \int_{t=t2}^{t3} (W(t) - Wc) \qquad (2)$$

Here, $\alpha(t)$ represents memory usage ratio of the virtual machine VM1 as a function of time, and Wc represents a power consumption amount of memory while a physical machine is idle. Also, W(t) represents a power consumption rate of memory while a physical machine is operating as a function of time. Therefore, the left integral term represents a steady part of power consumption amount of memory of the virtual machine VM1 taking its memory usage ratio into consideration (Step 512). The right integral term represents a variable part of power consumption amount of memory of the virtual machine VM1 (Step 514). Here, if adopting this calculation formula (2), it is necessary to obtain and store the memory usage ratio $\alpha(t)$ and the power consumption rate of memory W(t) during an operation of the virtual machine VM1. Here, instead of obtaining these parameters, an overall power consumption amount of memory Jm(t) may be measured, and the average value of memory usage ratios at time t2 and t3 may be used for memory usage ratios. For example, the following formula may be used.

$$Jmem(t2, t3) = \frac{\alpha(t2) + \alpha(t3)}{2} \times Wc \times (t3 - t2) + (Jm(t3) - Jm(t2) - Wc \times (t3 - t2)) \quad (3)$$

Here, as for memory usage ratios, the average value of memory usage ratios α(t2) and α(t3) is used in the above formula. Alternatively, only α(t2) or α(t3) may be used instead.

The power consumption amount of memory calculated here is accumulated to a previously accumulated power consumption amount of memory (an entry M1 in the VM power consumption amount table 600 in FIG. 6), and stored into the same location (Step 510).

Here, if an input/output controller is partially allocated to virtual machines, a usage ratio of the input/output controller allocated to a specific virtual machine may be identified based on a ratio of the part of the input/output controller to the whole, and a power consumption amount of the specific input/output controller may be calculated by substantially the same calculation method as for a memory. For other resources, the above calculation method of a power consumption amount of memory may be adopted depending on characteristics of the resources.

The present invention is not limited to the above formula.

[Power Consumption Amount of VMM Itself]

As a power consumption amount other than power consumption amounts of the virtual machines VM1-VM3, a power consumption amount of the virtual machine monitor VMM itself exists. For the flow in FIG. 5 from time t3 to t4, data from time t1 to t2 has been stored to be utilized. Therefore, a power consumption amount Jvmm(t1, t2) of the virtual machine monitor VMM from time t1 to t2 has been calculated at Step 522 in FIG. 5. Jvmm(t1, t2) may be calculated using the following formula (4), for example, if the power consumption rate WT(t) of the physical machine at time t has been measured.

$$Jvmm(t1, t2) = \int_{t=t1}^{t3} WT(t) \quad (4)$$

Alternatively, if the power consumption amount JT(t) of the physical machine at time t has been measured, it may be calculated as follows.

$$Jvmm(t1,t2) = JT(t2) - JT(t1) \quad (5)$$

Jvmm(t1, t2) obtained in this way is accumulated to a value in an entry v1(610) for power consumption amount of the virtual machine monitor in FIG. 6, and written back to the same entry v1.

Also, a power consumption amount may be calculated for time when none of multiple virtual machines are allocated with a CPU.

Here, the present invention is not limited to the above formulas.

[Calculation Example of Power Consumption Amount of Power Source Unit]

For example, a power source unit (PSU) or a fan is a resource whose power consumption amount fluctuates depending on a power consumption amount of a specific virtual machine, and shared by multiple resources. Therefore, for example, the following method may be used for calculating a part of power consumption amount of the power source unit used by each of the virtual machines VM1-VM3. For example, power consumption amounts of resources (FIG. 6, 602) occupied by the respective virtual machines VM1-VM3 are added for the respective virtual machines VM1-VM3 to calculate subtotals of power consumption amounts Y1, Y2, and Y3 for the respective virtual machines VM1, VM2, and VM3 (612). Using the subtotals, a power consumption amount Jpsu(t) of the power source unit (PSU) at time t may be distributed to the virtual machines VM1-VM3 proportionately. A concrete formula may be as follows.

$$P1 = \frac{Y1}{Y1 + Y2 + Y3 + v1} \times Jpsu(t) \quad (6)$$

$$P2 = \frac{Y2}{Y1 + Y2 + Y3 + v1} \times Jpsu(t) \quad (7)$$

$$P3 = \frac{Y3}{Y1 + Y2 + Y3 + v1} \times Jpsu(t) \quad (8)$$

where v1 represents a power consumption amount of the virtual machine monitor VMM itself for managing the virtual machines VM1-VM3. As illustrated in FIG. 6 with entries 604, P1, P2, and P3 represent values distributed to the virtual machines VM1, VM2, and VM3 as parts of a power consumption amount of the power source unit PSU, respectively.

Similarly as above, power consumption amounts of a cooling fan or the like can be calculated for the respective virtual machines.

As illustrated in the VM power consumption amount table 600 in FIG. 6 power consumption amounts of resources for each of the virtual machines VM1, VM2, and VM3 are stored, with which total power consumption amounts X1, X2, and X3 (614) are calculated for the respective virtual machines VM1-VM3.

Figure 7:
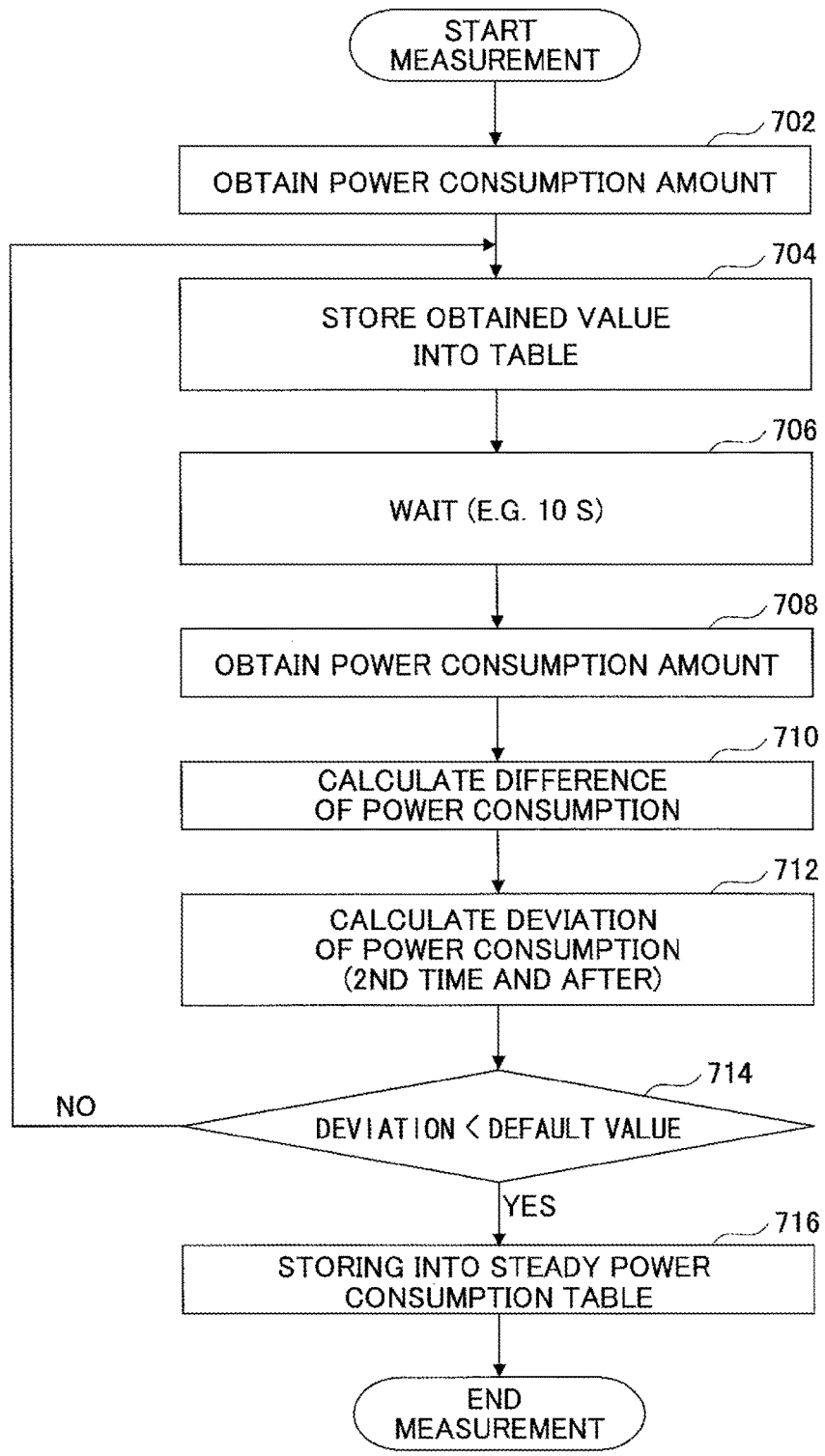
FIG. 7 is a flowchart for measuring a steady part of power consumption according to an embodiment.

FIG. 7 is a flowchart for measuring a steady part of power consumption amounts according to the present embodiment. For example, a steady part of power consumption amounts of a memory is calculated as follows. Here, for a resource other than a memory, such as a hard disk, it is calculated in a similar way. It is desirable to execute this procedure while a physical machine is idle.

At Step 702, a power consumption amount of memory 1 is obtained.

At Step 704, the obtained power consumption amount 1 is stored into a resource power consumption table 810 in FIG. 8.

At Step 706, wait for, for example, 10 s.

At Step 708, a power consumption amount of memory 2 is obtained.

At Step 710, the difference of the power consumption (power consumption amount 2−power consumption amount 1) is calculated.

At Step 712, a deviation is calculated with a power consumption amount calculated in the previous loop and a power consumption amount calculated in the current loop.

At Step 714, the deviation and a default value are compared. If the deviation is less than the default value (YES), the procedure goes to Step 716. If the deviation is greater than or equal to the default value (NO), the procedure goes back to Step 704.

If going back to Step 704, the previous power consumption amount of memory 2 is stored into the resource power consumption table 810, and the loop is repeated.

At Step 716, the power consumption amount value is stored into a steady power consumption table 820 in FIG. 8 because the measured power value is determined to indicate a steady value at Step 714, and the procedure ends.

The above procedure is executed for resources other than a memory.

FIG. 8 is a schematic view illustrating an example of tables related to steady power consumption amounts of resources. In FIG. 8, the resource power consumption table 810 stores measured results of power consumption (power consumption amount for 10 s) for the resources.

The steady power consumption table 820 in FIG. 8 stores steady values of power consumption rates of the resources obtained by the procedure in FIG. 7. P-idle-mem represents steady power consumption rate W1 of memory. P-idle-io represents steady power consumption rate W2 of an input/output interface. P-idle-disk represents steady power consumption rate W3 of a disk.

Figure 9:
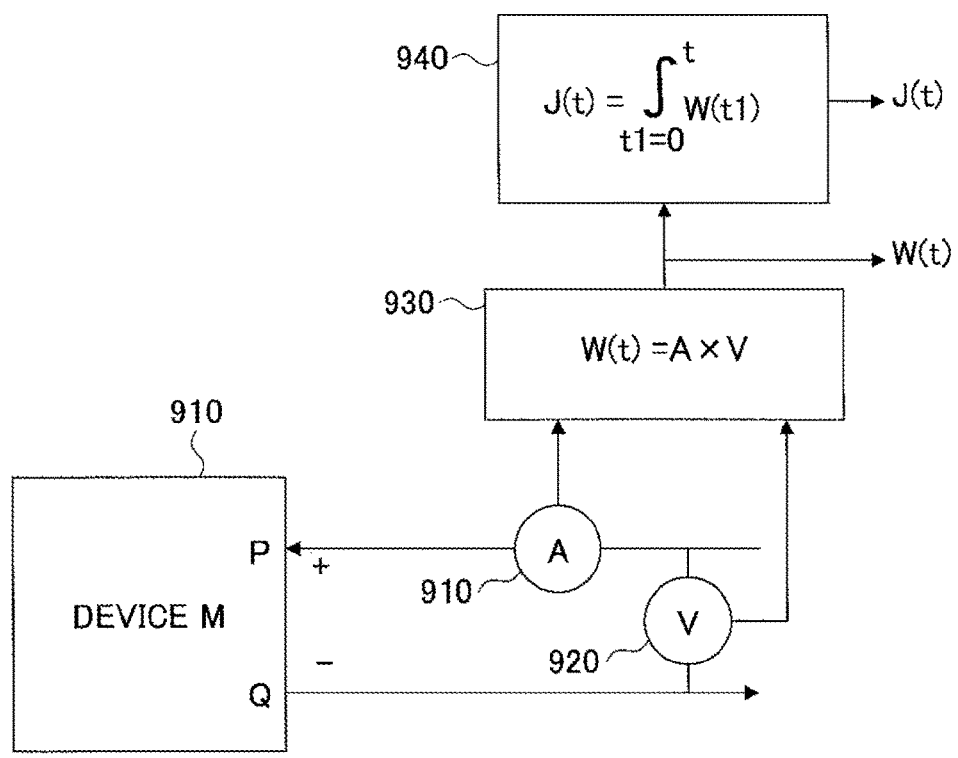
FIG. 9 is a schematic view illustrating a measurement example of power consumption and a power consumption amount of a device according to an embodiment.

FIG. 9 is a schematic view illustrating a measurement example of power consumption rate and a power consumption amount of a device M according to the present embodiment. The device M as a resource is supplied power at terminals P and Q. An amperemeter 910 and a voltmeter 920 are disposed on a power supplying path. Representing a current value by A and a voltage value by V at time t, power consumption rate W(t) at time t is calculated by the following formula with a power consumption calculator 930.

$$W(t) = A \times V$$

In addition, by integrating the power consumption rate with a power consumption amount calculator 940, a power consumption amount J(t) of the device M is calculated as follows.

$$J(t) = \int_{t1=0}^{t} W(t1) \quad (9)$$

The power consumption calculator 930 and the power consumption amount calculator 940 may be implemented by an analog circuit or a digital circuit. By disposing such power measuring circuits for resources, it is possible to obtain power consumption amounts of the resources as functions of time, respectively.

Figure 10:
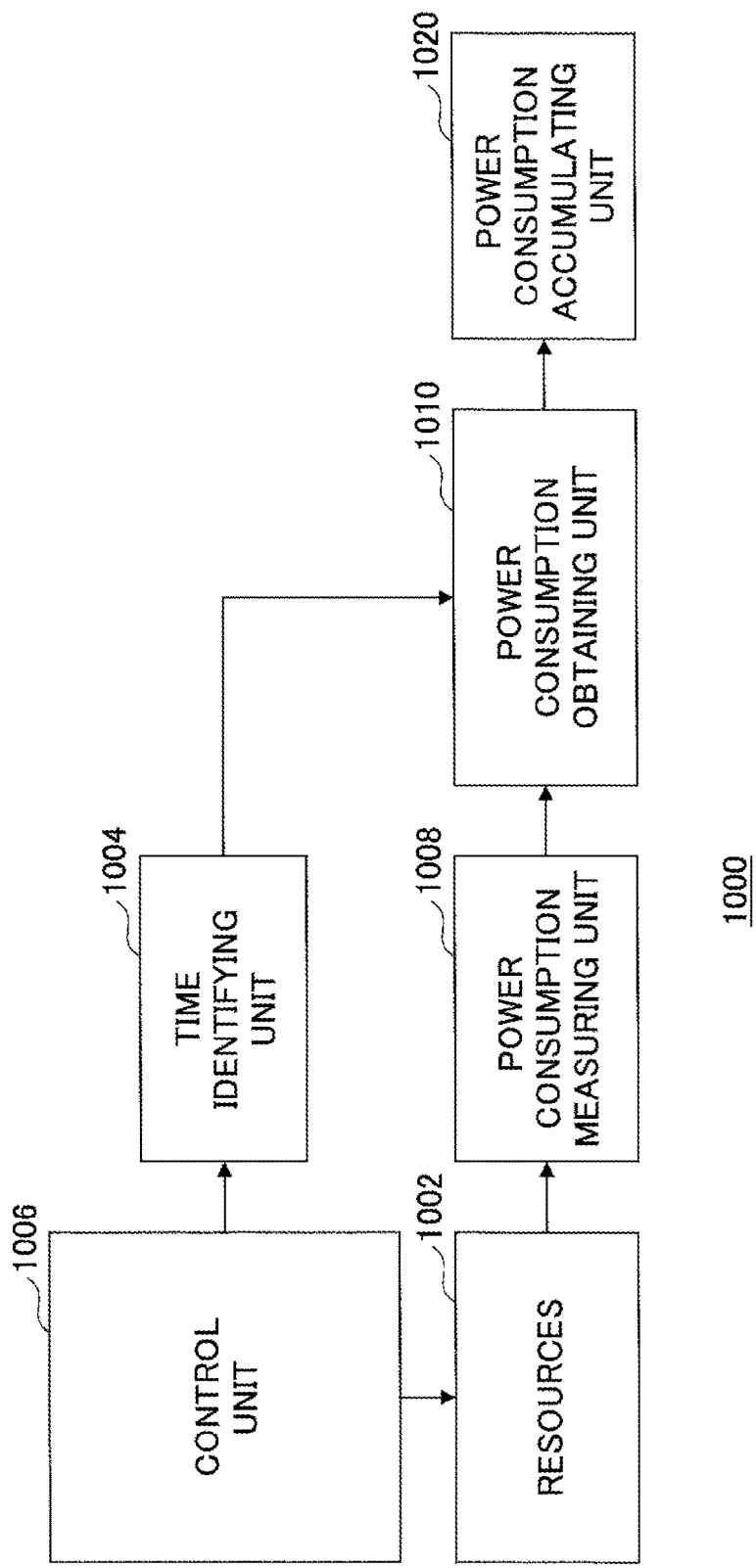
FIG. 10 is a functional block diagram according to an embodiment.

FIG. 10 illustrates an example of a functional block diagram 1000 that implements the process described, for example, in [Calculation example of power consumption amount of CPU] or [Power consumption amount of VMM itself].

A control unit 1006 has a function for allocating a predetermined resource 1002 to a specific virtual machine, and identifies the time when the resource is allocated.

A power consumption amount measuring unit 1008 measures power consumption amounts of the resource.

A power consumption amount obtaining unit 1010 obtains and outputs a power consumption amount of the resource at the identified time. For example, it obtains power consumption amounts of a CPU at a start time and an end time of a duration during which a CPU is continuously allocated to the virtual machine VM1. The obtained power consumption amount of the CPU for the duration is added to the entry C1 for VM1 in the VM power consumption amount table in FIG. 6. Here, a resource 1002 may be a CPU, an input/output controller, a bus, a network controller, or any other one of the resources that consume power and shared by the virtual machines VM1-VM3. Procedures for the resources are the same as described above for a CPU, and description is omitted.

A power consumption amount of the virtual machine monitor VMM itself may be obtained, for example, by identifying a start time and an end time of a duration during which a CPU is continuously allocated to the virtual machine monitor VMM (i.e., no virtual machines are allocated with the CPU) based on time information from the time identifying unit 1004, and accumulating power consumption amounts of multiple resources for the duration (power consumption amount of the physical machine itself) that are to be shared by the virtual machines VM1-VM3. By adding the obtained power consumption amount to the value of v1 in the storage area 610 in FIG. 6, an accumulated value of the power consumption amount of the virtual machine monitor VMM is stored into v1.

Figure 11:
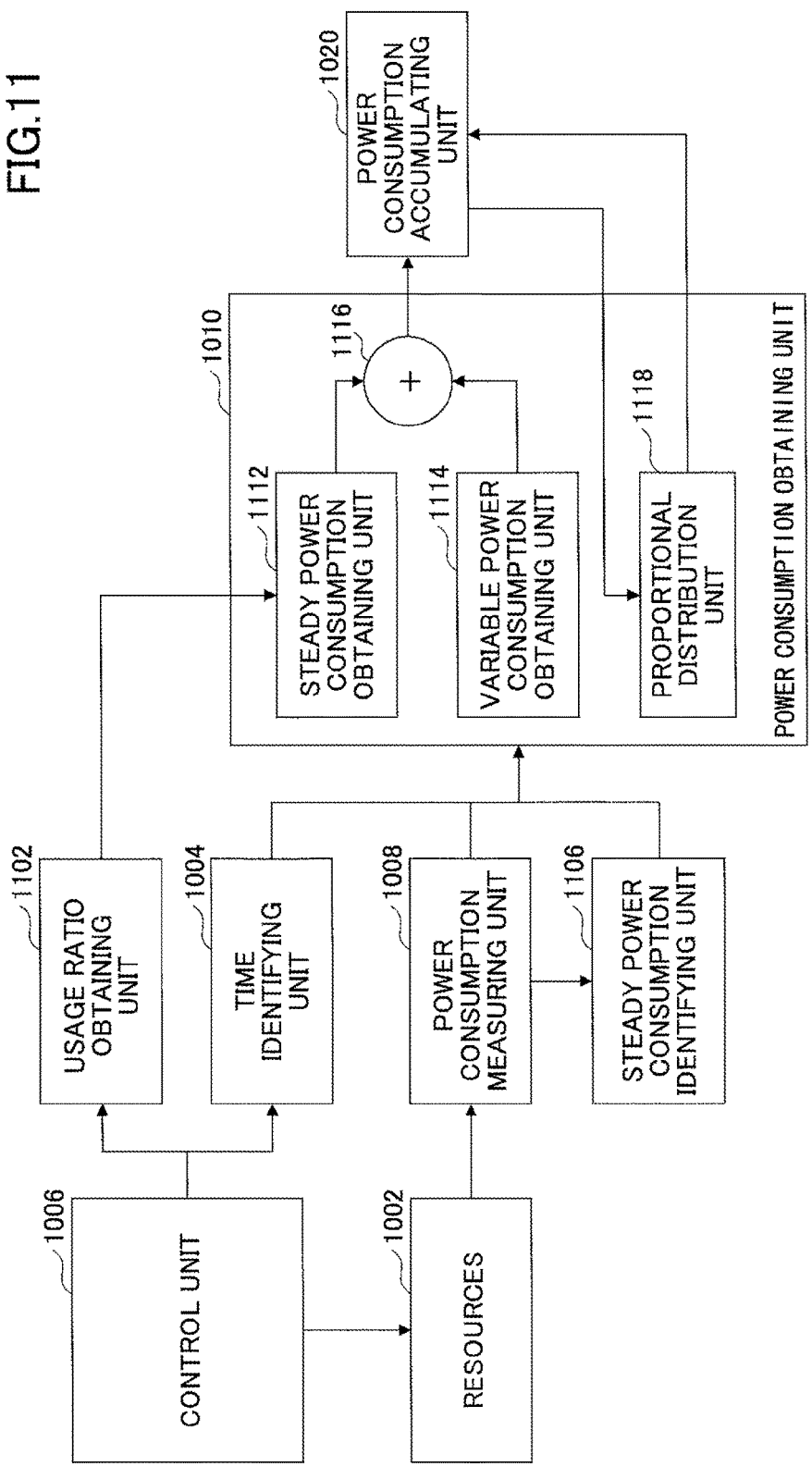
FIG. 11 is another functional block diagram according to an embodiment.

FIG. 11 illustrates an example of a functional block diagram 1100 that implements the process described, for example, in [Calculation example of power consumption amount of memory] or [Calculation example of power consumption amount of power source unit]. Here, the same blocks as in FIG. 10 are designated with the same numerical codes, and their description is omitted.

A usage ratio obtaining unit 1102 obtains memory usage ratios of the virtual machines VM1-VM3 that occupy certain memory areas. Usage ratios may be obtained for resources other than a memory, for example, a hard disk, a silicon disk, or any other of various storage devices. Alternatively, if a part of input/output ports of an input/output controller is occupied by one of the virtual machines VM1-VM3, usage ratios of the virtual machines VM1-VM3 on an input/output controller may be obtained. In this case, the input/output controller may have the same process applied as a memory to obtain power consumption amounts of the respective virtual machines VM1-VM3. Therefore, it is noted that the process described for a memory is applicable to the other resources in the present specification. This is the same for the following description.

A steady power consumption amount identifying unit 1106 executes the procedure described in FIG. 7. Namely, if a physical machine is in an idle state, it obtains a steady part of power consumption amount of the resources, and stores the part into the memory (for example, the steady power consumption table 820 in FIG. 8).

A steady power consumption amount obtaining unit 1112 may calculate the following term in formula (3) described above.

$$\frac{\alpha(t2) + \alpha(t3)}{2} \times Wc \times (t3 - t2)$$

Alternatively, it may calculate the left integral term in formula (2).

A variable power consumption amount obtaining unit 1114 may calculate the following term in formula (3) described above.

$$(Jm(t3) - Jm(t2) - Wc \times (t3 - t2))$$

Alternatively, it may calculate the right integral term in formula (2). Here, the present invention is not limited to these formulas.

An adder 1116 adds values output from the steady power consumption amount obtaining unit 1112 and the variable power consumption amount obtaining unit 1114, and outputs the added result to a power consumption amount accumulating unit 1020.

A proportional distribution unit 1118 may use the VM power consumption amount table 600 in FIG. 6 generated by the power consumption amount accumulating unit 1020. Specifically, using the subtotals 612 calculated in the VM power consumption amount table 600, it distributes power consumption amounts of the cooling fan, the power source unit (PSU) and the like to the virtual machines VM1-VM3. Proportionate distribution may be executed with, for example, the above formulas (6)-(8).

Here, the power consumption amount accumulating unit 1020 may calculate total power consumption amounts X1, X2, and X3 for the virtual machines VM1, VM2, and VM3, respectively, in the VM power consumption amount table 600 in FIG. 6.

Here, the present invention is not limited to the resources illustrated as examples in the VM power consumption amount table in FIG. 6. For example, for a resource dedicated for a specific virtual machine, a power consumption amount of the resource may be counted only for the specific virtual machine. Also, a resource connected by serial transfer or the like may operate at a timing later than an operation of the corresponding virtual machine. In this case, by identifying a virtual machine that makes the operation request to the resource, the power consumption amount of the resource may be associated with the virtual machine. In other words, it is noted that care should be taken as described above if there is a difference between a time interval for allocating a CPU to a specific virtual machine and a time interval used for counting the power consumption amount of a resource used by the specific virtual machine.

Figure 12:
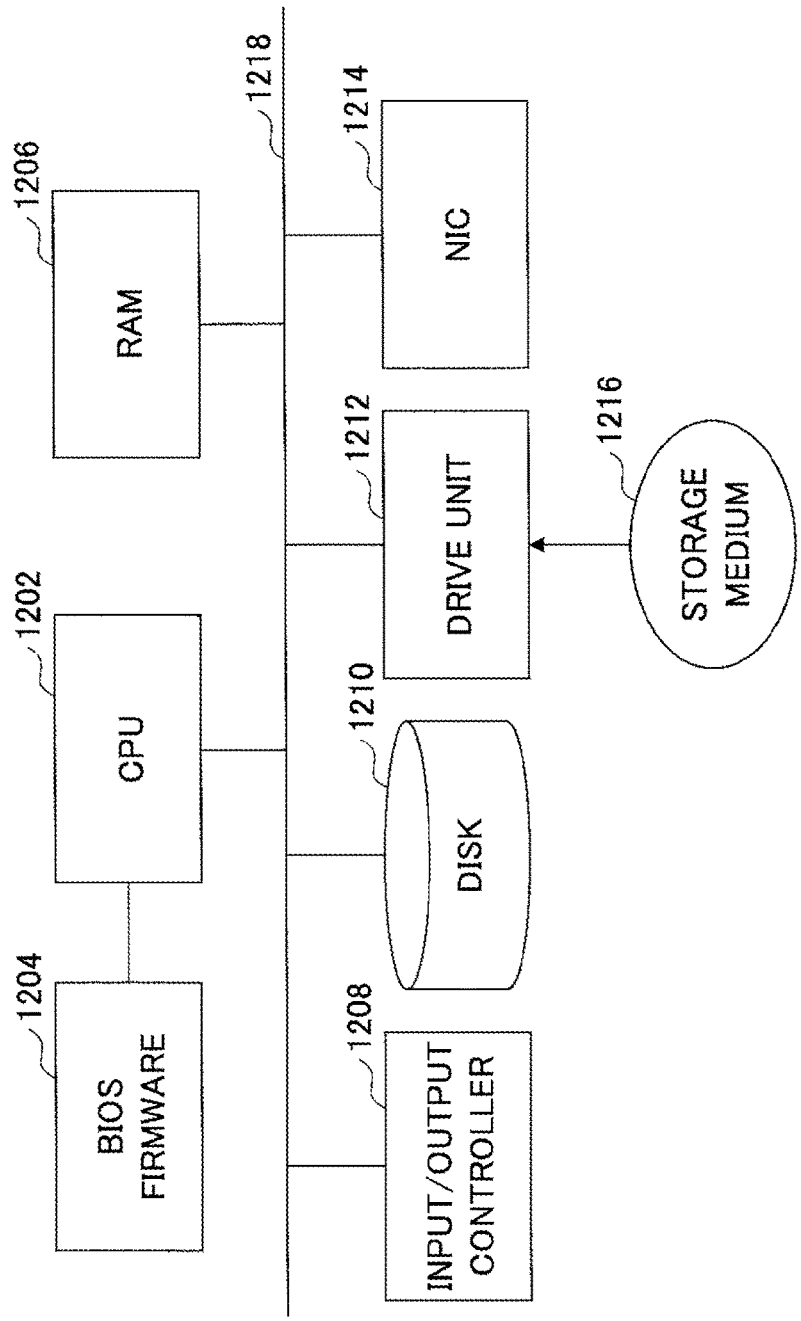
FIG. 12 is a schematic view illustrating a hardware configuration according to an embodiment.

FIG. 12 is a schematic view illustrating a hardware (computer) configuration according to the present embodiment. The hardware may include a CPU 1202, a BIOS firmware 1204, a RAM 1206, an input/output controller 1208, a disk 1210, a drive unit 1212, and a network interface card (NIC) 1214. These devices may be connected with each other by a bus 1208. Also, the drive unit 1212 can read from or write to a storage medium 1216. The NIC 1214 may be connected with a network (not illustrated here).

Here, all or a part of the present embodiment may be implemented by a program. The program may be stored into the storage medium 1216, the disk 1210, the RAM 1206, or the like. The storage medium 1216 is one or more non-transitory storage media having a structure. For example, the storage medium 1216 may be a magnetic storage medium, an optical disk, an optical-magnetic storage medium, a non-volatile memory, or the like. A magnetic storage medium may be an HDD, a flexible disk (FD), a magnetic tape (MT), or the like. An optical disk may be a DVD (Digital Versatile Disc), a DVD-RAM, a CD-ROM (Compact Disc-Read Only Memory), a CD-R (Recordable)/RW (ReWritable), or the like. Also, an optical-magnetic storage medium may be an MO (Magneto-Optical disk), or the like. By loading the program stored in the storage medium 1216 to have a CPU execute the program, all or a part of the present embodiment may be executed.

In a data center, virtual machines for multiple corporations may operate on a physical machine owned by the data center. In this case, the data center needs to charge the corporations for usage of virtual machines. If power consumption amounts of the virtual machines VM1-VM3 are obtained, they may be used as one of the factors for calculating charges for usage of the virtual machines VM1-VM3 for the respective corporations.

Also, corporations may need to disclose amounts of carbon dioxide emissions for accomplishing their corporate social responsibility. In general, this is called a "carbon footprint disclosure". From this viewpoint, a corporation may need to obtain a power consumption amount of a virtual machine that operates for the corporation if the corporation operates the virtual machine on a physical machine owned by another corporation. This is because the corporation needs to count the amount of carbon dioxide emissions corresponding to operations of the virtual machine used for the corporation as its own emissions.

Therefore, it becomes increasingly important to grasp power consumption amounts of virtual machines (and/or power consumption amounts of resources for respective virtual machines).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power consumption amount estimating apparatus, comprising:
   a memory that stores a power consumption amount table containing totals of previous power consumption amounts of resources in association with virtual machines operating on a physical machine; and
   a processor configured to execute a process including
      measuring power consumption amounts of a resource allocated to the virtual machines;
      identifying a start time and an end time of a duration during which a processor of the physical machine is continuously allocated for one of the virtual machines;
      obtaining a power consumption amount of the resource used for the one of the virtual machines during the duration based on the measured power consumption amounts corresponding to the start time and the end time; and
      adding the power consumption amount of the resource used for the one of the virtual machines during the duration to one of the totals of the previous power consumption amounts of the resource that is associated with the same one of the virtual machines in the power consumption amount table, and thereby estimating and totaling the power consumption amounts of the resources used by each of the virtual machines operating on the physical machine.

2. The power consumption amount estimating apparatus as claimed in claim 1, wherein the resource is the processor, an input/output controller, a bus, or a network controller of the physical machine.

3. The power consumption amount estimating apparatus as claimed in claim 1, wherein
   the resource is a storage section; and
   the obtaining includes
      identifying a steady power consumption of the storage section based on a power consumption amount of the storage section during an idle time of the physical machine, obtaining a usage ratio of the storage section by the one of the virtual machines, obtaining a steady power consumption amount of the storage section based on the steady power consumption, the usage ratio, the start time, and the end time, obtaining a variable power consumption amount of the storage section based on the measured power consumption amounts corresponding to the start time and the end time and the steady power consumption, and obtaining the power consumption amount of the storage section during the duration by adding the steady power consumption amount and the variable power consumption amount.

4. The power consumption amount estimating apparatus as claimed in claim 1, wherein the process further includes identifying a management start time and a management end time of a management duration during which the processor of the physical machine is not allocated for any of the virtual machines;

obtaining a management power consumption amount of the physical machine for managing the virtual machines based on power consumption amounts corresponding to the management start time and the management end time; and accumulating a plurality of the management power consumption amounts obtained during a plurality of the management durations for each of the virtual machines.

5. The power consumption amount estimating apparatus as claimed in claim 1, wherein the process further includes measuring a power consumption amount of a common resource commonly shared by the virtual machines, the power consumption amount of the common resource fluctuating depending on power consumption amounts of the virtual machines; and distributing the power consumption amount of the common resource to the virtual machines proportionately based on the power consumption amount of each of the virtual machines accumulated in the power consumption amount table.

6. The power consumption amount estimating apparatus as claimed in claim 1, wherein a part of the power consumption estimating apparatus is implemented with firmware of the physical machine whose level is lower than a virtual machine monitor managing the virtual machines.

7. A computer-implemented power consumption amount estimating method, the method comprising:

storing, in a memory, a power consumption amount table containing totals of power consumption amounts of resources in association with virtual machines operating on a physical machine;

measuring power consumption amounts of a resource allocated to the virtual machines;

identifying a start time and an end time of a duration during which a processor of the physical machine is continuously allocated for one of the virtual machines;

obtaining a power consumption amount of the resource used for the one of the virtual machines during the duration based on the measured power consumption amounts corresponding to the start time and the end time; and adding the power consumption amount of the resource used for the one of the virtual machines during the duration to one of the totals of the previous power consumption amounts of the resource that is associated with the same one of the virtual machines in the power consumption amount table, and thereby estimating and totaling the power consumption amounts of the resources used by each of the virtual machines operating on the physical machine.

8. The power consumption amount estimating method as claimed in claim 7, wherein the resource is a storage section; and the obtaining includes identifying a steady power consumption of the storage section based on a power consumption amount of the storage section during an idle time of the physical machine, obtaining a usage ratio of the storage section by the one of the virtual machines, obtaining a steady power consumption amount of the storage section based on the steady power consumption, the usage ratio, the start time, and the end time, obtaining a variable power consumption amount of the storage section based on the measured power consumption amounts corresponding to the start time and the end time and the steady power consumption, and obtaining the power consumption amount of the storage section during the duration by adding the steady power consumption amount and the variable power consumption amount.

9. The power consumption amount estimating method as claimed in claim 7, the method further comprising:

identifying a management start time and a management end time of a management duration during which the processor of the physical machine is not allocated for any of the virtual machines;

obtaining a management power consumption amount of the physical machine for managing the virtual machines based on power consumption amounts corresponding to the management start time and the management end time; and accumulating a plurality of the management power consumption amounts obtained during a plurality of the management durations for each of the virtual machines.

10. The power consumption amount estimating method as claimed in claim 7, the method further comprising:

measuring a power consumption amount of a common resource commonly shared by the virtual machines, the power consumption amount of the common resource fluctuating depending on power consumption amounts of the virtual machines; and distributing the power consumption amount of the common resource to the virtual machines proportionately based on the power consumption amount of each of the virtual machines accumulated in the power consumption amount table.

11. The power consumption amount estimating method as claimed in claim 7, wherein the resource is the processor, an input/output controller, a bus, or a network controller of the physical machine.

12. The power consumption amount estimating method as claimed in claim 7, wherein a part of the power consumption estimating method is implemented with firmware of the physical machine whose level is lower than a virtual machine monitor managing the virtual machines.

13. A non-transitory computer-readable recording medium having a program stored therein for causing a computer to execute a process, the process comprising:

storing, in a memory, a power consumption amount table containing totals of previous power consumption amounts of resources in association with virtual machines operating on a physical machine;

measuring power consumption amounts of a resource allocated to the virtual machines;

identifying a start time and an end time of a duration during which a processor of the physical machine is continuously allocated for one of the virtual machines;

obtaining a power consumption amount of the resource used for the one of the virtual machines during the duration based on the measured power consumption amounts corresponding to the start time and the end time; and adding the power consumption amount of the resource used for the one of the virtual machines during the duration to one of the totals of the previous power consumption amounts of the resource that is associated with the same one of the virtual machines in the power consumption amount table, and thereby estimating and totaling the power consumption amounts of the resources used by each of the virtual machines operating on the physical machine.

14. The non-transitory computer-readable recording medium as claimed in claim 13, wherein
the resource is a storage section; and
the obtaining includes
identifying a steady power consumption of the storage section based on a power consumption amount of the storage section during an idle time of the physical machine,
obtaining a usage ratio of the storage section by the one of the virtual machines,
obtaining a steady power consumption amount of the storage section based on the steady power consumption, the usage ratio, the start time, and the end time,
obtaining a variable power consumption amount of the storage section based on the measured power consumption amounts corresponding to the start time and the end time and the steady power consumption, and
obtaining the power consumption amount of the storage section during the duration by adding the steady power consumption amount and the variable power consumption amount.

15. The non-transitory computer-readable recording medium as claimed in claim 13, the process further comprising:
identifying a management start time and a management end time of a management duration during which the processor of the physical machine is not allocated for any of the virtual machines;
obtaining a management power consumption amount of the physical machine for managing the virtual machines based on power consumption amounts corresponding to the management start time and the management end time; and
accumulating a plurality of the management power consumption amounts obtained during a plurality of the management durations for each of the virtual machines.

16. The computer-readable recording medium as claimed in claim 13, the process further comprising:
measuring a power consumption amount of a common resource commonly shared by the virtual machines, the power consumption amount of the common resource fluctuating depending on power consumption amounts of the virtual machines; and
distributing the power consumption amount of the common resource to the virtual machines proportionately based on the power consumption amount of each of the virtual machines accumulated in the power consumption amount table.

17. The non-transitory computer-readable recording medium as claimed in claim 13, wherein the resource is the processor, an input/output controller, a bus, or a network controller of the physical machine.

18. The non-transitory computer-readable recording medium as claimed in claim 13, wherein a part of the program is implemented with firmware of the physical machine whose level is lower than a virtual machine monitor managing the virtual machines.

* * * * *